United States Patent [19]

Kates et al.

[11] 4,130,726

[45] Dec. 19, 1978

[54] LOUDSPEAKER SYSTEM EQUALIZATION

[75] Inventors: James M. Kates, Norfolk; Robert A. Berkovitz, Lexington, both of Mass.

[73] Assignee: Teledyne, Inc., Los Angeles, Calif.

[21] Appl. No.: 811,297

[22] Filed: Jun. 29, 1977

[51] Int. Cl.² ............................................. H04R 3/04
[52] U.S. Cl. ................................................. 179/1 D
[58] Field of Search ............ 179/1 D; 333/28 R, 70 T

[56] References Cited

U.S. PATENT DOCUMENTS

| 3,624,298 | 11/1971 | Davis et al. | 179/1 D |
| 3,860,892 | 1/1975 | Speiser et al. | 333/70 T |

FOREIGN PATENT DOCUMENTS

| 2502009 | 8/1975 | Fed. Rep. of Germany | 179/1 D |
| 1400275 | 7/1975 | United Kingdom | 179/1 J |

Primary Examiner—George G. Stellar
Attorney, Agent, or Firm—Schiller & Pandiscio

[57] ABSTRACT

Variations in the amplitude-frequency response characteristic of a loudspeaker are compensated by a drive circuit in which an audio input signal is summed with a plurality of delayed replicas of the input signal to provide a drive signal for the loudspeaker. The delayed replicas are derived by discrete time filtering. Noise reduction techniques applied to the least delayed of the plurality of delay signals substantially improves the S/N ratio in the drive signal.

8 Claims, 20 Drawing Figures

LOUDSPEAKER SYSTEM EQUALIZATION

This invention relates to audio transducers, and particularly although not exclusively, to loudspeakers.

The frequency range over which the amplitude-frequency response characteristic of a loudspeaker is sufficiently flat for high fidelity audio applications, is limited. At low frequencies, the efficiency of the loudspeaker falls to produce a marked decline in the amplitude-frequency response characteristic. The point at which the response of the loudspeaker starts to decline significantly with decreasing frequency is broadly related to the size of the loudspeaker. At high frequencies, the amplitude-frequency response characteristic of a loudspeaker commonly exhibits marked variations which can seriously impare the tonal quality of music and the like reproduced by the loudspeaker. Broadly, the point at which such marked variations in response start to occur with increasing frequency is also related to loudspeaker size; the larger the loudspeaker the lower the frequency at which the variations occur.

The marked variations in the response of loudspeakers at higher frequencies are often substantially periodic in the frequency domain, i.e. there is a periodic or regularly varying component in the amplitude response of a loudspeaker as the frequency of an applied signal is progressively increased. For example, in a typical mid-range loudspeaker there may be peaks in the amplitude response characteristic at 2, 6, 10, etc. kHz, and troughs at 4, 8, 12, etc. kHz. It is believed that this periodic variation in response is caused by the interaction of sound wave reflections with the loudspeaker structure. One such reflection phenomenon is known as "cone break-up"; the loudspeaker cone moves as a rigid piston at low frequencies, but at high frequencies it behaves as a transmission line. Sound vibration, generated at the voice coil attached to the center of the cone, travels radially outwardly through the cone, is reflected back again from the edge of the cone, and thus sets up a standing wave pattern. These reflections can be reduced by mechanical damping of the cone material, but damping correspondingly reduces the high frequency output of the loudspeaker and no significant increase is obtained in the frequency range over which the loudspeaker is useful for high fidelity applications.

Other marked variations in loudspeaker response are due to mechanical resonances in which sound waves of specific frequencies excite resonant structures in the speaker or its mounting.

A number of attempts have been made to extend the useful frequency range of loudspeakers. For example, U.S. Pat. No. 3,582,553 (Bose) describes a loudspeaker arrangement driven through a compensating network. The compensating network has an amplitude-frequency response characteristic which is substantially flat over the range of frequencies for which the loudspeaker characteristic is flat, and which rises at higher and lower frequencies to compensate for the decline in the loudspeaker characteristic at those frequencies. The compensating network described however, does not compensate for the periodic variations in response exhibited by many loudspeakers at the higher frequencies.

It is an object of the present invention to extend the frequency range over which a loudspeaker can be used to provide high fidelity reproduction.

It is a more specific object of the present invention to provide a loudspeaker arrangement in which variations in the amplitude-frequency response characteristic resulting from reflections and/or mechanical resonances (i.e. regardless of origin) are reduced or substantially eliminated. To these ends, the present invention provides speaker equalization (i.e. correction of speaker response to obtain a substantially flat frequency-amplitude response characteristic) through incorporation of discrete time filter means in the input to the speaker. Generally, the present invention provides audio transducer apparatus including audio transducer means and drive means for providing electrical driving signals to the transducer means, the drive means being responsive to an input audio signal to provide the driving signals as a linear combination of the input signal and at least one delayed replica of the input signal generated by a discrete time filter.

A specific embodiment of the present invention provides audio transducer apparatus including transducer means and drive means therefor, the amplitude-frequency response characteristic of the drive means including a component which varies periodically in the frequency domain, the variations of said component being substantially equal in periodicity and opposite in sense to a periodic component of the variation with frequency of the amplitude response of the transducer means.

Typically, the drive means comprises a discrete time filter responsive to an input audio signal to provide a delayed replica of the latter, with a delay corresponding to half the period of a reflection or resonance associated with the transducer means, and signal summing means connected to sum delayed and input signals to provide a drive signal for the transducer means. The effect of summing the delayed and input signals is to provide the drive means as a whole with an amplitude response which varies periodically with frequency, the variations corresponding in periodicity and being in the opposite sense to the variations in the amplitude-frequency response characteristic of the transducer means which result from the mechanical resonance. The range of the periodic variations in the response characteristic of the drive means can be selected to correspond generally with that of the variations in the response characteristic of the transducer means by appropriate selection of the gain in the delay means. Thus, at least approximate compensation for the effect of a mechanical resonance in the transducer means can be achieved with a relatively uncomplicated compensating circuit. More precise compensation and/or compensation for the effects of a plurality of mechanical resonances can be achieved by providing further delayed signals with appropriately selected delays and gain coefficients for summation with the input signal, and/or by providing one or more delayed feedback signals.

Other objects of the invention will in part be obvious and will in part appear hereinafter. The invention accordingly comprises the apparatus possessing the construction, combination of elements, and arrangement of parts, and the process including the several steps and the relation of one or more of such steps with respect to each of the others, all of which are exemplified in the following detailed disclosure and the scope of the application of which will be indicated in the claims.

For a fuller understanding of the nature and objects of the present invention, reference should be had to the following detailed description taken in connection with the accompanying drawings wherein.

Discrete time filtering, as the phrase and its derivatives are used here, is intended to distinguish that class of filters the input signal to which is time-sampled, one or more of the samples being used to form an output signal, from a digital filter in which not only sampling is achieved but the samples are converted to digitally encoded form such as binary signals and the like. The term "filter" is used in its broad sense to refer to a device or system which separates signals, data and the like according to some specified criteria. Hence as will be apparent that, for example, digital filters are simply species of discrete time filters.

Figure 1:
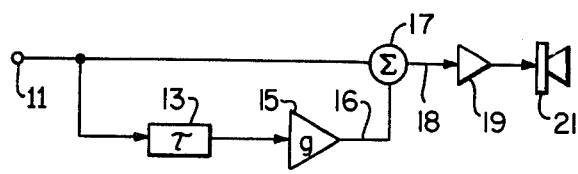
FIG. 1 is a schematic circuit illustration of loudspeaker apparatus in accordance with the invention.

FIG. 1 is a schematic illustration showing the principal features of one embodiment of loudspeaker apparatus embodying the principles of the present invention, and comprising an input terminal 11 for an input audio signal. A series-connected discrete time filter such as delay means 13 and gain selection means 15 (such as a settable gain amplifier, resistors or the like) are connected to receive the input signal at terminal 11 and provide a delayed amplified signal on line 16. Signal summing means 17 is connected to both terminal 11 for receiving the input signal and to line 16 for receiving the delayed signal, to provide on line 18 a drive signal as a linear combination thereof. The input of power amplifier 19 is connected to line 18 to amplify the drive signal for supply to the loudspeaker 21.

The delayed signal provided on line 16 by the series-connected filter or delay means 13 and gain selection means 15 corresponds to the input signal supplied to the terminal 11, delayed by a constant time delay $\tau$ provided by delay means 13 and multiplied by a constant gain coefficient g provided by gain selection means 15. Summation of the delayed signal with the input signal at summing means 17 thus provides an overall transfer function for the circuit of the form:

$$y(t) = x(t) + gx(t-\tau) \quad (1)$$

where x(t) and y(t) are the input and drive signals respectively expressed as functions of time. It can be shown that the above transfer function provides a frequency response of the form:

$$H(f) = 1 + g \cdot e^{-j2\pi f\tau} \quad (2)$$

where H(f) is the response at frequency f.

Figure 2:
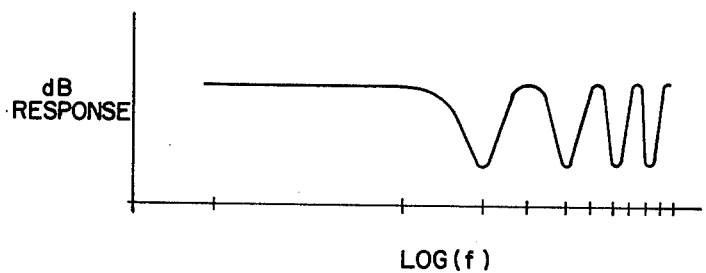
FIG. 2 is a plot of the amplitude-frequency responce characteristic of the drive means of the apparatus of FIG. 1.

The amplitude characteristic of the frequency response of equation (2) is illustrated generally in FIG. 2 where the amplitude response is plotted in dB on the Y-axis and the frequency is plotted logarithmically on the X-axis. It can be seen that the amplitude response varies periodically with frequency, troughs in the response occuring at frequencies of $\frac{1}{2}\tau$, $3/2\tau$, . . . $(2n-1)/2\tau$, and peaks occuring at frequencies of $1/\tau$, $2/\tau$, . . . $n/\tau$. The range of the variations in response depends upon the value selected for g.

Figure 3:
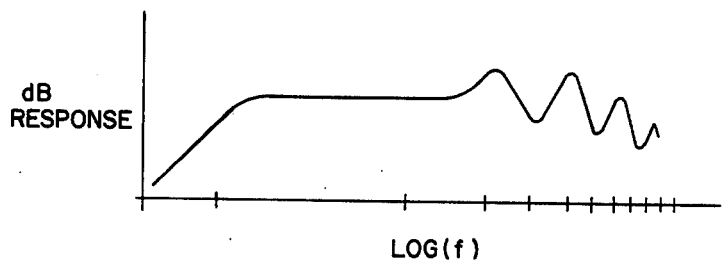
FIG. 3 is a plot illustrating the principal features of the amplitude-frequency response characteristic of a typical loudspeaker.

FIG. 3 illustrates, by way of example, the principal features of a typical loudspeaker amplitude frequency response characteristic, showing in particular the effect of "cone break-up" on the response. As can be seen, at lower frequencies in the loudspeaker response band the response is relatively flat. As the frequency is increased, however, cone break-up starts to occur producing a marked peak in the response characteristic at about 2kHz, followed by periodic fluctuations in response with further peaks at 6, 10, etc. kHz and dips at 4, 8, 12, etc. kHz. The loudspeaker thus exhibits a transmission line type resonance with a fundamental frequency of 2kHz.

It will be noted that the variations in the amplitude-frequency response characteristic of the drive circuit as illustrated in FIG. 2 are generally complementary to those in the loudspeaker response characteristic which are caused by cone break-up. Accordingly, by selecting of the delay means 13 in the drive circuit to equal half the period of the resonance in the loudspeaker that is to say $\frac{1}{4}$ msec. in the example given above, and by appropriate selection of g, the response of the drive circuit has dips at 2, 6, 10, etc. kHz and peaks at 4, 8, 12, etc. kHz which substantially compensate, to a first order of approximation, for the periodic variations in the amplitude frequency response characteristic of the loudspeaker.

In practice, the variations in response of a drive circuit such as that illustrated do not exactly complement the variations caused by a resonance phenomenon. Although the variations in the two cases may have identical periodicities and ranges, the shape of the curves could differ. Nevertheless, provision of a drive circuit with just one delay does provide an elegant and simple solution of the problem of compensating to a first order of approximation the type of periodic variation in frequency response caused by a transmission line type resonance in a loudspeaker. Moreover, a loudspeaker with several transmission line type resonances having unrelated fundamental frequencies (the combined effect of which could be to produce apparently irregular and random fluctuations in the amplitude frequency response characteristic) can similarly be compensated to a first order of approximation by providing just one delay for each resonance.

Figure 4:
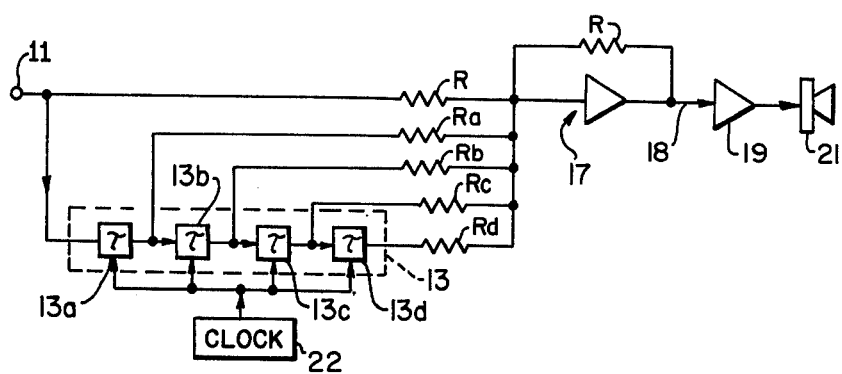
FIG. 4 is a schematic illustration of an embodiment of the invention in which the delay means provides a drive signal as a linear combination of an input signal and a plurality of delayed replicas thereof.

FIG. 4 is a schematic illustration of loudspeaker apparatus in accordance with the principles of the present invention, in which the loudspeaker is driven by a drive signal provided by means for forming the drive signal by the summation of the input signal with a plurality of delayed signals. Delay means 13 comprises a plurality of delay sections 13a, 13b, etc. each having a delay constant $\tau$, and connected in cascade to provide delayed signals with respective delays $\tau$, $2\tau$, $3\tau$, etc. The output of each delay section 13a, 13b, etc. is coupled through a corresponding resistor $R_a$, $R_b$, etc., the latter is turned being coupled to summing network 17, such as an operational amplifier. Thus, the delayed signals are summed by summing network 17, the respective gain coefficients being selected by appropriate selection of the corresponding resistors $R_a$, $R_b$, etc., to provide the drive signal on line 18.

Preferably, the delay means comprises signal storage means arranged to store successively sampled values of the input signal and subsequently recall those values in sequence to provide the delayed signal. Conveniently, the signal storage means can be formed by a solid state tapped analog delay device which samples the input audio signal at terminal 11, stores each sample as a capacitive charge and successively transfers the charge to other capacitors, hence is known in the art as a "bucket brigade" device. To clock the sampling and transfer by analog delay device 13', there is provided clock 22, preferably a square wave generator operating at appropriate frequencies and coupled to device 13'. Resistors $R_a$, $R_b$, etc. are connected with respective tapping points on delay device 13'. Such a device is described, for example, in Reticon Application Note No. 105 entitled "A Tapped Analog Delay for Sampled Data Signal Processing", published by the Reticon Corporation, Sunnyvale, California.

However, present typical NMOS tapped analog delay lines have a noise problem, the source of which is not known to the manufacturers apparently because there is not yet a fully theoretical understanding of the noise producing mechanism. Consequently, tapped analog delay lines such as the Reticon Model TAD-32 have a signal-to-noise ratio of about 60dB when the output is measured at any one tap. This ratio, while acceptable for many applications, causes considerable difficulty in an audio system because of the quite environmental conditions under which many people listen.

Figure 13:
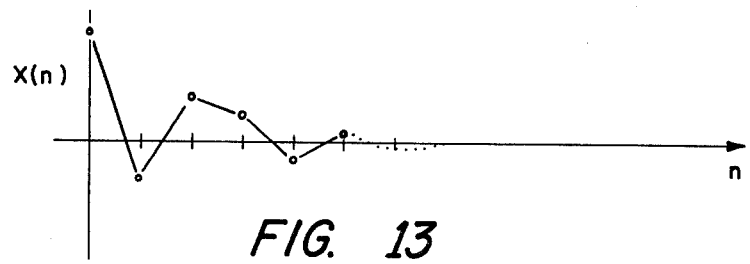
FIG. 13 is a plot of a typical impulse response of a tapped analog delay line or filter.

As shown in FIG. 13, a speaker correction filter employing a tapped analog delay line such as the Reticon TAD-32, in general has a large first tap weight followed by smaller tap weights. The filter impulse response is such that the output value at the first tap is generally three or four times larger than that which follows at any of the following taps. Thus, the signal-to-noise ratio at the first tap location will tend to dominate system performance. Conventional noise reduction, such as companding, around the entire filter will work only if expansion is provided for each output tap, since the expansion of a sum of compressed signals will not be the same as the sum of each expanded signal. Such conventional noise reduction would therefore be very expensive. However, by improving the signal-to-noise ratio at the first tap location one can greatly improve the measured performance of the filter.

Figure 14:
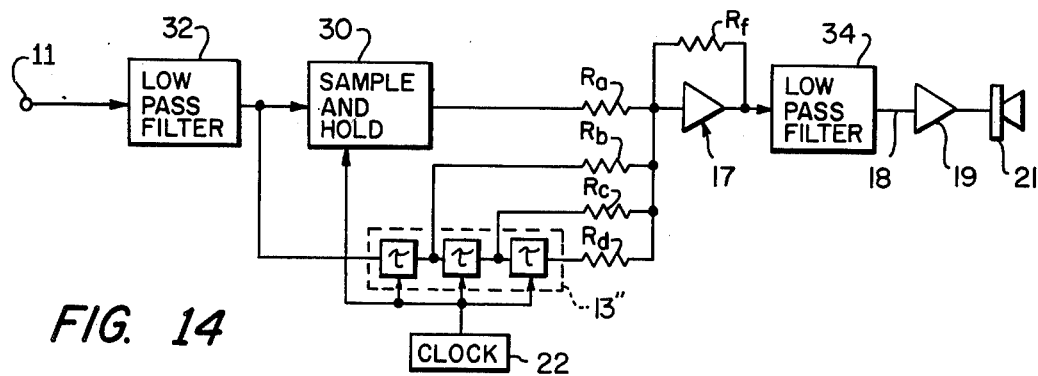
FIG. 14 is an alternative embodiment of the device of FIG. 4.

Thus, in an alternative variation of the embodiment of FIG. 4 in an all sampled version as shown in FIG. 14, the device includes at least one, separate, low-noise sample-and-hold circuit 30 having its input connected through low pass (e.g. 19KHz) preferably elliptical filter 32 to terminal 11. Filter 32 serves to limit the analog audio signal at terminal 11 to avoid aliasing problems. The output of sample-and-hold circuit 30 constitutes the first tap location connected through resistor $R_a$ to the summing input junction of operational amplifier 17. The following taps of successively lesser weights are provided by tapped analog delay line 13" (which is shown for the sake of brevity in illustration as including only three output taps) which has its input connected to terminal 11. The weighted outputs of the taps from analog delay line 13" are also summed at the input of operational amplifier 17. In order to permit an increase in the weighting provided by resistors $R_b$, $R_c$ and $R_d$, the feedback resistance $R_f$ of operational amplifier 17 is selected so that the overall gain of the amplifier is unity. This permits easier adjustment of the tap weights and offers possible additional reduction in noise. Clock 22 (typically a 40 KHz source) is connected to analog delay line 13" and to sample-and-hold circuit 30 so as to control the operation of both devices. The output of amplifier 17 is connected to the input of a smoothing low-pass filter 34, the output of the latter being connected through line 18 to power amplifier 19 and transducer 21. Sample-and-hold circuit 30 can be made to have a signal-to-noise ratio of over 85 dB as compared to 60dB at a single tap of a Model TAD-32 delay line. If the first tap is four times larger than the next tap weight, an overall improvement of about 12dB in signal-to-noise ratio can be achieved.

Figure 15:
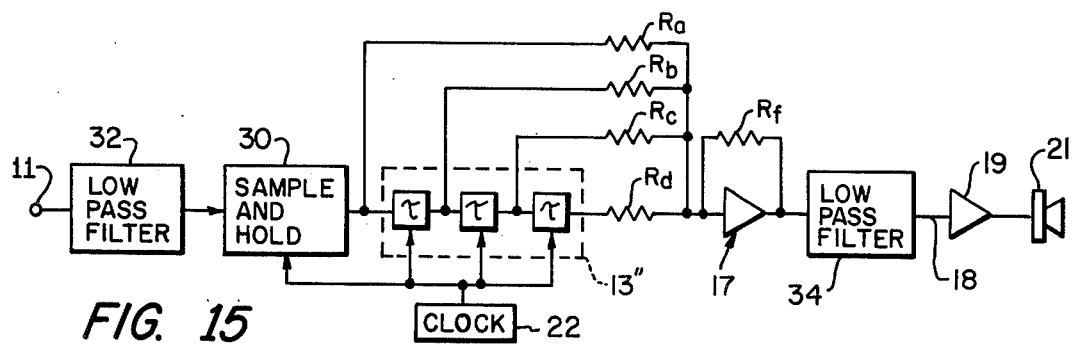
FIG. 15 is a variation of the embodiment of FIG. 14.

As shown in FIG. 14, sample-and-hold circuit 30 is connected in parallel with delay line 13", the output of circuit 30 being summed at the input summing junction of amplifier 17 together with the tapped outputs from delay line 13". However, in an alternative embodiment, such as shown in FIG. 15, sample-and-hold circuit 30 can be in series with delay line 13 instead of in parallel.

Figure 16:
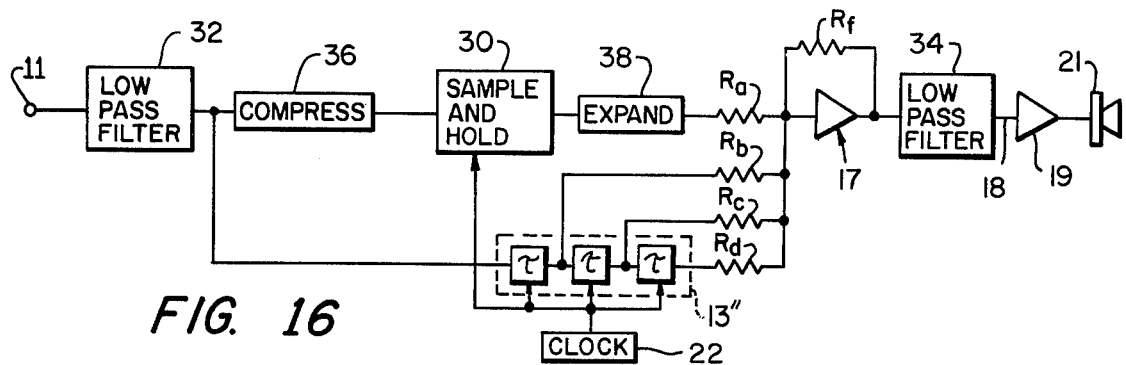
FIG. 16 is another variation of the embodiment of FIG. 14.

A modification of the device of FIG. 14 is shown in FIG. 16 wherein a conventional signal compressor 36 is coupled between anti-aliasing filter 32 and the input of sample-and-hold circuit 30, a corresponding signal expander 38 being connected between the output of sample-and-hold circuit 30 and the input summing junction of amplifier 17. Any of a number of known compander systems, such as the dbx system or Dolby B system, can be used for this purpose. In any of the embodiments shown in FIG. 14 – FIG. 16 inclusive, one can add additional parallel or series sample-and-hold circuits to achieve yet further noise reduction provided that the tap weights in the output of the subsequent sample-and-hold circuits are much greater than the weight at any tap following such additional or subsequent sample-and-hold circuit.

As an alternative to the use of a tapped analog delay device as delay means 13 in FIG. 4, charge-coupled devices (CCD's) can be used advantageously, particularly if relatively large numbers of drive means are required with similar characteristics. Such a requirement might arise, for example, in the commercial production of loudspeaker units in accordance with the invention, which have virtually identical loudspeakers. With CCD's signal delay, attenuation and summation can all be effected on the integrated circuit chip, so that although the chip may need to be custom designed for a particular model of loudspeaker, the number of separate circuit components and interconnections in each delay means can be substantially reduced. Suitable CCD's are described in greater detail in the article "Consider CCD's for a wide range of uses" in Electronic Design, Mar. 15, 1976.

Figure 5:
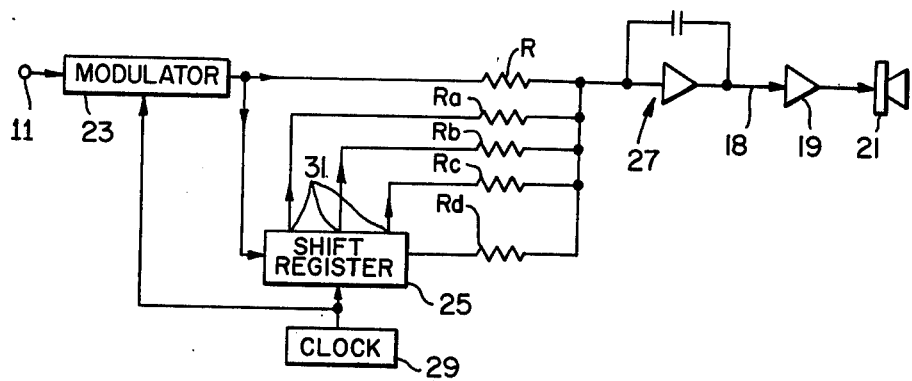
FIG. 5 is a schematic illustration of an embodiment similar to that of FIG. 4 in which the delayed signals are stored in digital form.

Yet a further embodiment, involving digital rather than analog storage in the delay means, is illustrated schematically in FIG. 5. The embodiment comprises a discrete time modulator, preferably a delta modulator 23, a digital shift register 25 and a combined integration and summing network 27 to provide the loudspeaker drive signal on line 18. Modulator 23 produces, in response to clock pulses provided by clock pulse generator 29, a stream of pulses with amplitudes representing positive and/or negative increments such that the time integral of the series of increments substantially corresponds to the analog input signal. Delta modulators (and other PCM modulation systems useful in the present invention) are described in *Electronics Engineers' Handbook*, 1st Ed. McGraw Hill Book Co., (1975), pp. 14–42 to 14–46. By appropriate selection of the two voltage levels representing the pulse amplitudes, therefore, the pulse signals may be re-converted to the analog form merely by time integration of the signal. The stream of pulses is stepped through the shift register 25 (which serves as delay means 13) also under the control of the clock pulse generator 29, to provide a plurality of delayed replicas of the input signal, in digital form, on respective tapping points 31. As in the embodiment of FIG. 4, the delayed signals are gain-weighted by resistors $R_a$, $R_b$, etc. and summed together with the input signal in summing network 27 (typically an integrating operational amplifier) which simultaneously effects time integration of the summed signals. The summing network thus produces the required drive signal directly in analog form on line 18.

As discussed above, summation with the input signal of one or more delayed replicas of the input signal produces an amplitude-frequency response characteristic which compensates the effect of transmission line type resonances in a loudspeaker to a first order of approximation, but in general the shape of the characteristic does not exactly correspond to that of the loudspeaker characteristic. Greater flexibility in the tailoring of an amplitude-frequency response characteristic can be had by providing delayed feedback in the drive means.

Figure 6:
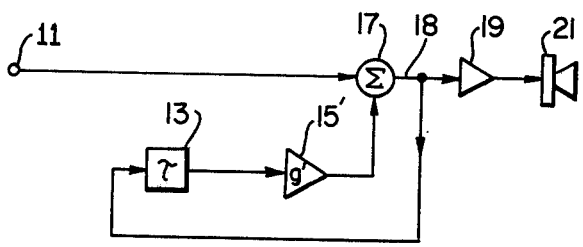
FIG. 6 is a schematic illustration of apparatus in accordance with the invention in which the drive means provides a delayed feedback signal for summation with the input signal.

FIG. 6 is a schematic illustration of apparatus in accordance with the invention, with delayed feedback. The arrangement is essentially identical to that of FIG. 1 except that the input to delay means 13 is connected to the output of signal summing means 17 to receive the drive signal y(t) instead of the input signal x(t). Gain selection means 15 provides gain g. The impulse response of the drive means of FIG. 6 corresponds to the linear combination of the input signal with a delayed signal comprising an infinite series of components correspond to the input signal delayed by respective multiples of the time delay constant $\tau$:

$$y(t) = x(t) + g'x(t-\tau) + g'^2x(t-2\tau) \times g'^3x(t-3\tau) + \ldots$$

Figure 7:
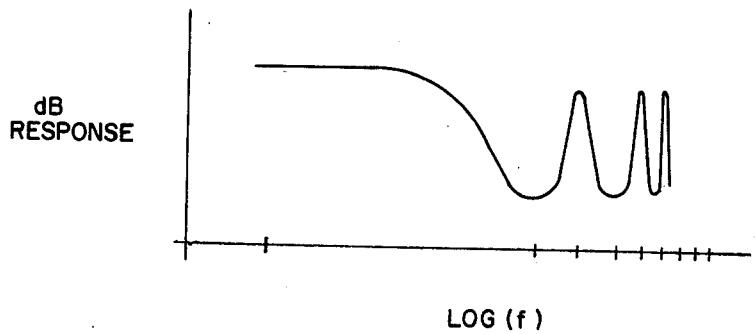
FIG. 7 is a plot of the amplitude frequency response characteristic of the drive means of FIG. 6.

The amplitude-frequency response characteristic of the drive means of FIG. 6 is illustrated in FIG. 7. It is to be noted that this is similar to the response characteristic illustrated in FIG. 2 in that the response varies periodically with frequency, but the shape of the variations is rather different. In FIG. 2, the variations comprise a series of relatively broad peaks separated by relatively narrow troughs, whereas in FIG. 7 the reverse is the case. It will be appreciated, therefore, that by suitably combining pluralities of delayed feedback and delayed feedforward signals, a wide variety of different amplitude frequency response characteristics can be produced. For a more comprehensive discussion of this topic, reference should be made to the book: "Digital Signal Processing" by Oppenheim & Schafer, Prentice Hall Inc. 1975.

Figure 8:
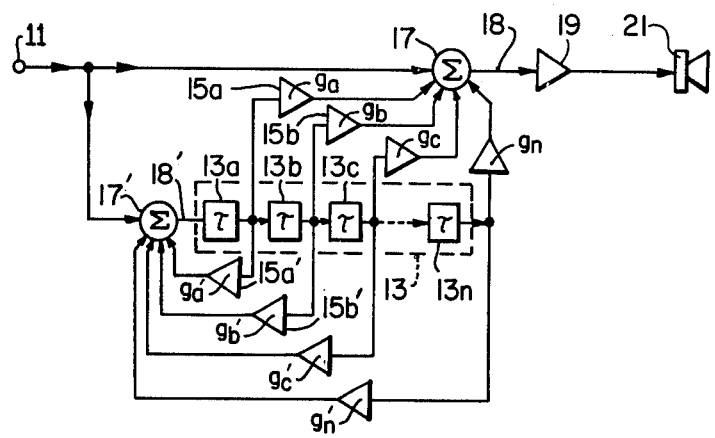
FIG. 8 is a schematic illustration of apparatus in accordance with the invention in which the drive signal is formed as a linear combination of delayed feedforward and delayed feedback signals.

Loudspeaker apparatus in accordance with the invention in which the delay means includes both delayed feedback and delayed feedforward paths is illustrated in FIG. 8, the apparatus being arranged so that common delay means $13a \ldots 13n$ are shared by the feedforward and feedback paths. The embodiment includes both signal summing means 17 which provides an output signal to line 18, and further signal summing means 17' responsive to the input and delayed signals to provide on line 18' a signal for supply to the signal delay means. Separate gain coefficients $g_a, \ldots g_n$ and $g'_a, \ldots g'_n$ can be selected for the feedforward paths and feedback paths respectively so that the drive signal and the signal supplied to the signal delay means can be formed by different combinations of the input and delayed signals.

Figure 9:
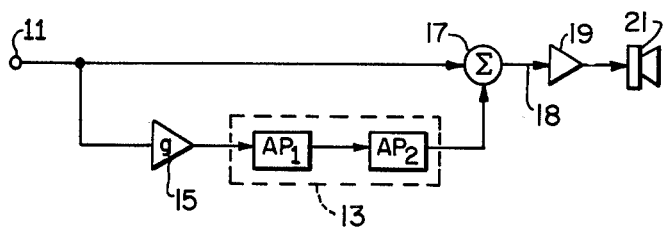
FIG. 9 is a schematic illustration of an embodiment of the invention including analog signal delay means.

FIG. 9 illustrates a practical embodiment of the invention in the same form as FIG. 1 except that one or more conventional lumped element analog filters are used to approximate the required delay. Thus, delay means 13 comprise first and second all-pass phase shift filters $AP_1$ and $AP_2$ having transfer functions of the form:

$$H(s) = \frac{s^2 - as + b}{s^2 + as + b}$$

Figure 10:
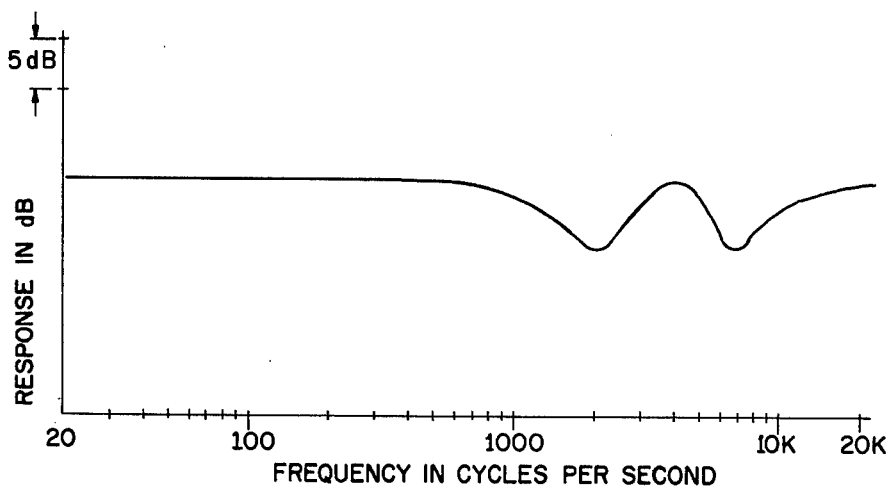
FIG. 10 is a plot of the amplitude-frequency response characteristic of the filter of FIG. 9.

One example of such a filter was constructed with the circuit parameters chosen as follows:

$AP_1$: $a = \sqrt{2} (2500) (2\pi)$; $b = (2500(2\pi))^2$
$AP_2$: $a = 0175(5100) (2\pi)$; $b = (5100(2\pi))^2 g = 0.413$ The frequency response of the filter as measured is illustrated in FIG. 10. As can be seen, the response characteristic has two troughs at 2 and 6.5kHz respectively separated by a peak at about 4 kHz. Further peaks in the response characteristic could be produced by the addition of further all-pass filters with suitably selected circuit parameters.

Figure 11:
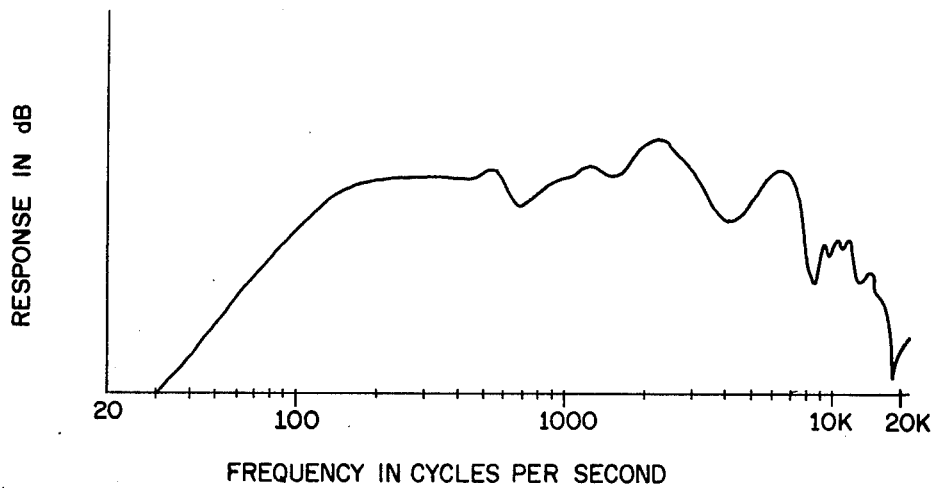
FIG. 11 is a plot of the amplitude-frequency response characteristic of the loudspeaker of FIG. 9.
Figure 12:
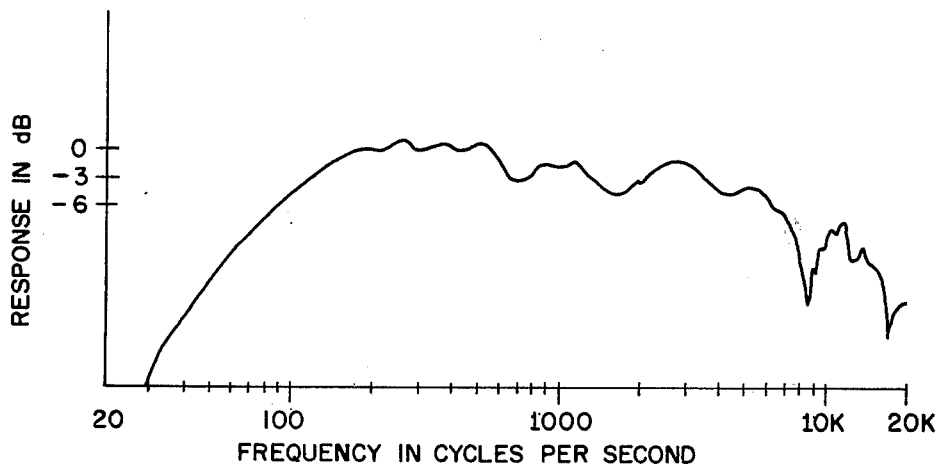
FIG. 12 is a plot of the amplitude-frequency response characterisitc of the complete apparatus of FIG. 9.

The measured amplitude frequency response characteristic of the loudspeaker of the apparatus of FIG. 9 is illustrated in FIG. 11. As can be seen this has three major irregularities, peaks at 2 kHz and 6.5 kHz and trough at about 4 kHz, so that the variations in the response of the drive means broadly compensates for those irregularities. The overall response of the loudspeaker apparatus, as measured with the loudspeaker driven via the compensating circuit described, is illustrated in FIG. 12.

Figure 18:
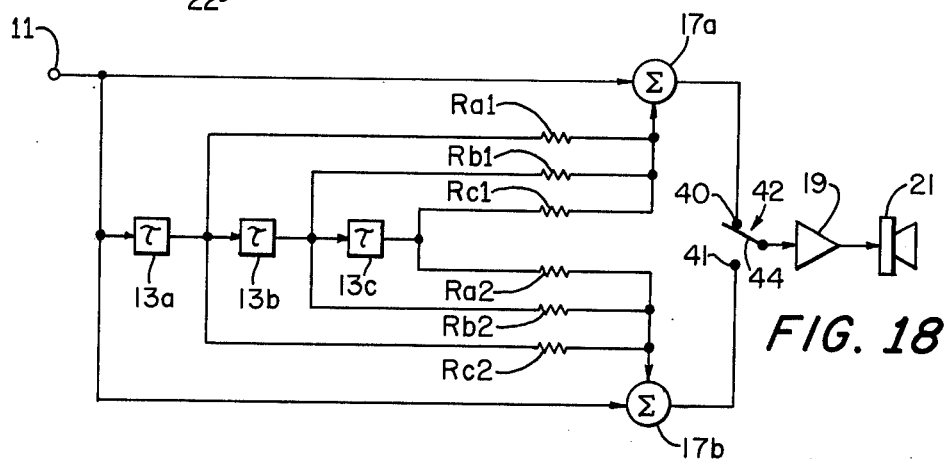
FIG. 18 shows a modification of the present invention in which a plurality of gain selection means are coupled to the output taps of a tapped delay line to yield different sets of gain coefficients.

It will be appreciated that one can employ a discrete time filter with multiple switched coefficient sets to permit choice of compensation desired according to the relative position of a speaker and listener in a room. Any of the several embodiments shown such as in FIGS. 4, 5, 8 and the like can readily be modified to this end. For example, FIG. 18 illustrates such a modification of the circuit of FIG. 4 (clock 22 being omitted for simplicity) in which delay means 13 comprises a plurality of delay sections 13a, 13b and 13c. The outputs of each of the latter are respectively coupled, as in FIG. 3 to first summing network 17a through corresponding resistors Ra1, Rb1 and Rc1 which provide gain coefficients. However, the outputs of delay sections 13a, 13b and 13c are also respectively coupled to second summing network 17b through corresponding resistors Ra2, Rb2 and Rc2 which provide another set of gain coefficients. Input terminal 11 is also connected to respective summing inputs of networks 17a and 17b. The outputs of the latter are connected to respective fixed contacts 40 and 41 of switch means 42, the armature or movable contact 44 of which is connected to the input of amplifier 19. The output of the latter is coupled to speaker means 21.

Figure 19:
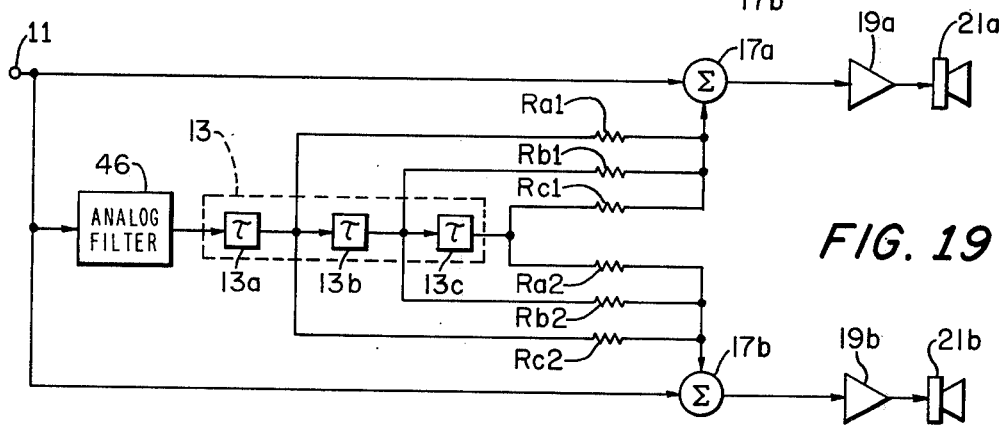
FIG. 19 shows an alternative to the embodiment of FIG. 18.

In the embodiment of FIG. 19, each coefficient set of resistors (Ra, Rb1, Rc1 and Ra2, Rb2 and Rc2) coupled to a common discrete time filter feeds a different power amplifier rather than a single amplifier through a switch as in FIG. 18. Thus, in FIG. 19, two power amplifiers 19a and 19b are provided each coupled to the output of a respective one of summing networks 17a and 17b. The outputs of amplifiers 19a and 19b are respectively coupled to corresponding speakers 21a and 21b. In the embodiment of FIG. 19 however, filtering is achieved with a compound filter formed of a fixed value analog filter means 46 for relatively wide-band connection and discrete time filter 13 for relatively narrow-band connection, filters 46 and 13 being connected in series between input terminal 11 and the inputs to power amplifiers 19a and 19b. However, analog filter means 46 can be formed of individual filters (formed of combinations of capacitors, resistors and/or inductors) disposed between the output terminals of power amplifiers 19a and 19b and the input terminals of speakers 21a and 21b. Using the embodiments of either FIG. 18 or 19, one can establish the values of the respective set of multiple resistors so that the gain coefficients are those needed for optimal equalization of the loudspeaker axial response when heard from a specific angle with regard to the loudspeaker system. Thus, the user can choose a listening position best suited to his own placement of the system in a desired room.

Figure 17:
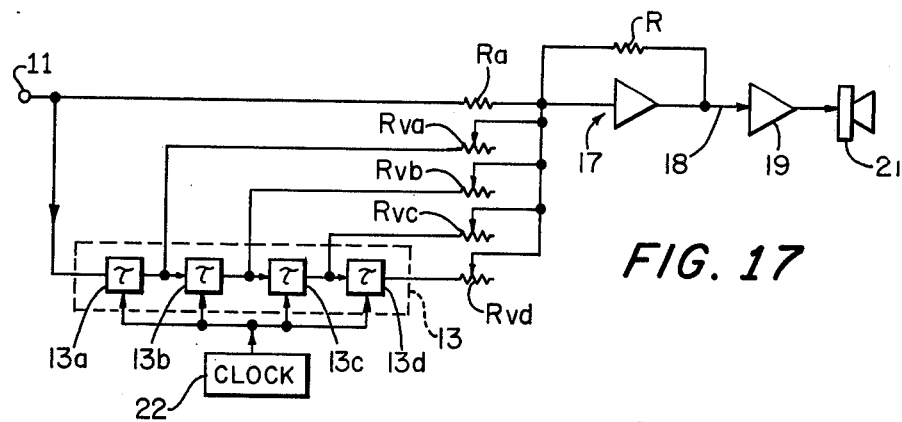
FIG. 17 shows an alternative embodiment of FIG. 4.

The sets of resistors which provide desired gain coefficients need not be fixed and to that end, for example, in the embodiment of FIG. 17, there is shown a system similar to that of FIG. 4 in which however the fixed resistor set of the latter has been replaced with variable resistors Rva, Rvb, Rvc and Rvd, so that one can vary within limits, the axial response of the speaker.

In a speaker of the type herein described, equalization of the axial response will also yield a flat, total power output if the transducer is small in diameter relative to the shortest wave-length that the transducer is designed to radiate. Thus, if one employs a group of transducers (such as the usual combination of woofer, mid-range and tweeter) in a speaker system with filtering to restrict appropriately the frequency range of the signals supplied to each transducer, each transducer being driven by a power amplifier preceded by a discrete time filter as hereinbefore described designed to provide a uniform axial frequency response, the entire system will give a uniform power response.

In order to achieve the foregoing equalization, the present invention uses a discrete time filter in which the several delayed replicas provided are then weighted (by choice of respective gain coefficients) preferably according to the impulse response (i.e. the time domain response) of the speaker.

To determine the desired gain coefficients for the discrete time filter, one can simply build the desired system using individual stabilized operational amplifiers in place of the resistor sets shown for example as resistors Ra, Rb, Rc and Rd in the embodiment of FIG. 4. Repeated signal impulses are then applied at input terminal 4 while the operational amplifiers are connected in a feedback arrangement to form an adaptive filter of the type described in the literature, as by Widrow, et al. Readings are then taken of the output signals from the operational amplifiers, and such readings can be used to establish the resistive coefficients required to achieve an optimum desired impulse response of a similar speaker system.

Figure 20:
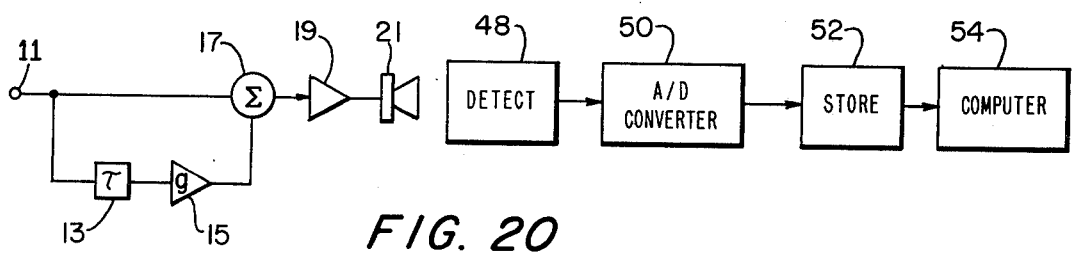
FIG. 20 illustrates schematically means for determing desired sets of gain coefficients for use in the present invention.

Alternatively, one can provide in the field, for incorporation of a series discrete time filter with coefficients automatically determined according to the precise location of the speaker system in a room, hall or the like. To this end, as shown in FIG. 20, there is provided at the installation site of the speaker system (exemplified by speaker 21 and associated elements) detector 48, preferably a calibrated condenser microphone. The output of the latter is coupled to an analog-to-digital converter 50 (which preferably includes a sample-and-hold circuit at its input) wherein the output signals from detector 48 are converted to digital signals. These digital signals are fed to buffer storage 52 and thence to computer 54 for processing. Typically computer 54 can be a minicomputer with self-contained storage of for example, 128 signal smaples. The computer serves to compute the desired gain coefficients for gain selector 15 to compensate for low frequency room modes or eigenmodes. The coefficients, for example, can be computed for a discrete time filter which achieves a minimum squared error through the use of the known Wiener-Kolmogorov algorithm or other similar known algorithms for filter synthesis.

Since certain changes may be made in the abve apparatus without departing from the scope of the invention herein involved, it is intended that all matter contained in the above description or shown in the accompanying draiwngs shall be interpreted in an illustrative and not in a limiting sense.

What is claimed is:

1. In audio transducer apparatus comprising audio transducer means having an amplitude-frequency response characteristic including plural resonances and drive means for producing electrical driving signals for driving said transducer means responsively to an input audio signal, the improvement wherein said drive means includes signal delay means for providing a plurality of delayed replicas of said input signal, each replica including a component corresponding to said input signal delayed by a respective delay period substantially equal to half the period of a corresponding one of said resonances;

signal summing means responsive to said input signal and delayed replicas to provide said drive signal as a linear combination thereof, and means for reducing the noise with respect to at least the least delayed of said plurality of delayed replicas, whereby substantial equilization of said apparatus is achieved.

2. Audio transducer apparatus as defined in claim 1 wherein said means for reducing the noise comprises a sample-and-hold circuit for providing said least delayed replica;

said signal delay mans comprises a tapped analog delay device for providing others of said delayed replicas; and said signal summing means comprises an analog summing network connected to receive said delayed signals from respective taps on said tapped analog delay device and from said sample-and-hold circuit.

3. Audio transducer apparatus as defined in claim 2 wherein said means for reducing the noise comprises companding means coupled to said sample-and-hold circuit for reducing the noise in the signal provided by the latter.

4. Audio transducer apparatus as defined in claim 2 wherein said sample-and-hold circuit is connected in parallel with said tapped analog delay device.

5. Audio transducer apparatus as defined in claim 2 wherein said sample-and-hold circuit is connected in series before said tapped analog delay device.

6. In an audio transducer system comprising audio transducer means having an amplitude-frequency response characteristic including at least one resonance, and drive means for producing electrical driving signals thereto responsively to an input audio signal, the improvement wherein said drive means includes signal delay means for providing at least one delayed rplica of said input signal, said replica including a component corresponding to said input signal delayed by a delay period substantially equal to half the period of said resonance;

first gain setting means for amplifying said delayed replica by a first gain factor;

second gain setting means for amplifying said delayed replica by a second gain factor;

first signal summing means responsive to said input signal and the delayed replica amplified by said first gain factor, to provide one driving signal as a linear combination of said input signal and the delayed replica amplified by said first gain factor; and second signal summing means responsive to said input signal and the delayed replica amplified by said second gain factor to provide another driving signal as a linear combination of said input signal and the delayed replica amplified by said second gain factor; whereby substantial equalization of said system is achieved.

7. The improvement in an audio transducer system as defined in claim 6 including means for selectively switching the input of said audio transducer means between the output terminals of said first and second signal summing means so as to be driven alternatively by either said one or another driving signals.

8. The improvement in an auido transducer system as defined in claim 6 wherein said audio transducer means comprises first and second transducers each coupled to be driven by a respective one of said one or another driving signals.

* * * * *